United States Patent
Schultz et al.

(10) Patent No.: US 8,076,236 B2
(45) Date of Patent: Dec. 13, 2011

(54) SRAM BIT CELL WITH SELF-ALIGNED BIDIRECTIONAL LOCAL INTERCONNECTS

(75) Inventors: Richard T. Schultz, Fort Collins, CO (US); Donald R. Weiss, Fort Collins, CO (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 32 days.

(21) Appl. No.: 12/475,989

(22) Filed: Jun. 1, 2009

(65) Prior Publication Data
US 2010/0301482 A1 Dec. 2, 2010

(51) Int. Cl.
*H01L 21/4763* (2006.01)
(52) U.S. Cl. .. 438/637; 439/299; 439/675; 257/E21.641
(58) Field of Classification Search .......... 438/299, 438/622, 637–640, 672, 675; 257/E21.641
See application file for complete search history.

(56) References Cited

U.S. PATENT DOCUMENTS
6,180,530 B1 * 1/2001 Liaw et al. .................. 438/706
2007/0034968 A1 * 2/2007 Nishida et al. ............... 257/369

OTHER PUBLICATIONS

Schultz, Richard T., Selective Local Interconnect to Gate in a Self Aligned Local Interconnect Process, U.S. Appl. No. 12/475,796, filed Jun. 1, 2009.

* cited by examiner

*Primary Examiner* — Thanhha Pham
(74) *Attorney, Agent, or Firm* — Ditthavong Mori & Steiner, P.C.

(57) ABSTRACT

Improved SRAMs are formed with significantly reduced local interconnect to gate shorts, by a technique providing bidirectional, self-aligned local interconnects, employing a gate hard mask over portions of the gates not connected to the local interconnects. Embodiments include forming a gate hard mask over gates, forming bidirectional trenches overlying portions of the gate electrodes and active silicon regions, etching the hard mask layer to expose regions of the gate electrodes that are to connect to local interconnects, and filling the trenches with conductive material to form self-aligned local interconnects.

10 Claims, 5 Drawing Sheets

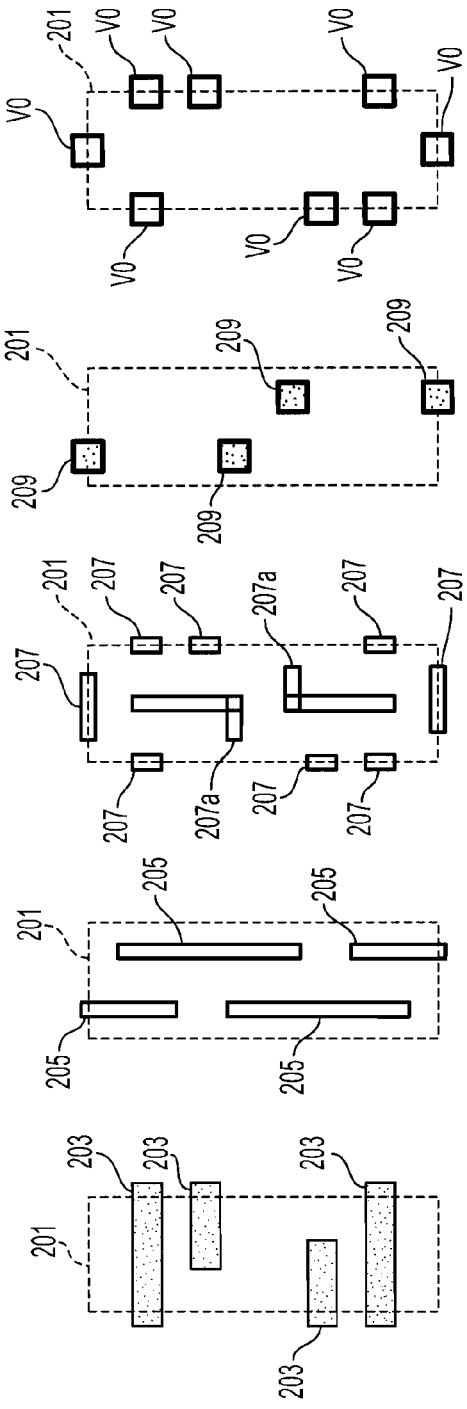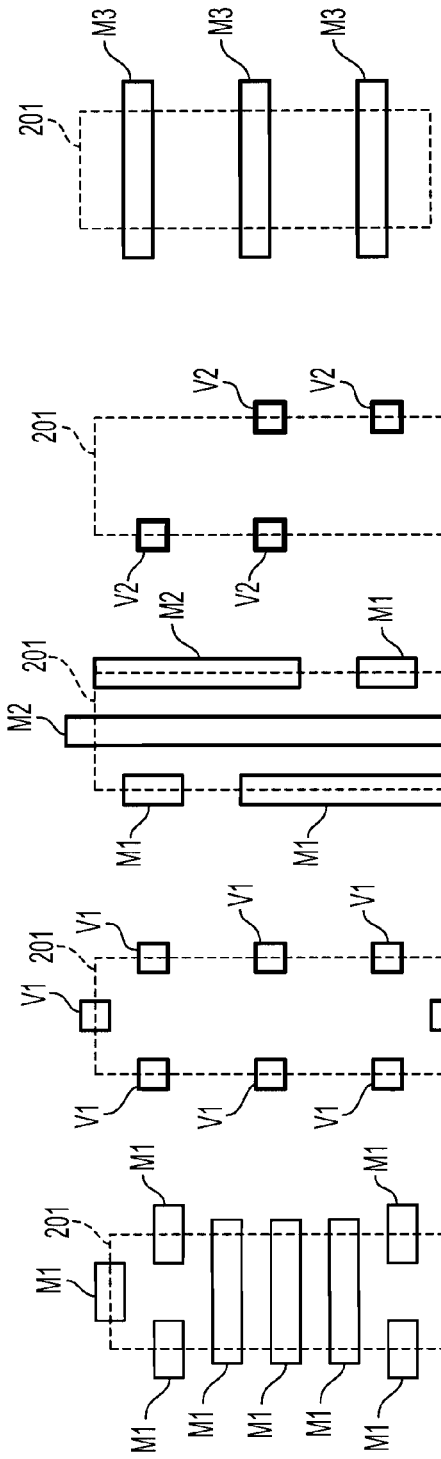

SRAM BIT CELL WITH SELF-ALIGNED BIDIRECTIONAL LOCAL INTERCONNECTS

TECHNICAL FIELD

The present disclosure relates to a method of fabricating miniaturized SRAM cells exhibiting good lithographic printability and reduced local interconnect to gate shorts. The present disclosure is particularly applicable in fabricating SRAMs with finfets for 20 nanometer and 15 nanometer technology nodes.

BACKGROUND

As the dimensions of transistor devices continue to shrink, various issues arise imposing increasing demands for methodology enabling the fabrication of semiconductor devices having good lithographic printability. Smaller transistors allow more transistors to be placed on a single substrate, thereby allowing relatively large circuit systems to be incorporated on a single, relatively small die area. A sidewall image transfer (SIT) process for defining gates for fin-shaped field effect transistors produces transistors with smaller channel lengths and a smaller gate pitch, which exhibit higher current drive strength and less capacitance, and can operate at higher frequency, thus providing overall increased device performance. However, smaller transistors require reduced feature sizes and overall device scaling. Aggressive scaling of, e.g., a six transistor static random access memory (6T SRAM) cell, can be difficult with a SIT based FIN definition for a FINFET for 20 nanometer (nm) and 15 nm technology nodes and beyond, since the FIN pitch sets the SRAM cell size. Stated another way, the SRAM cell size is related to an integer multiple of the FIN pitch.

Lithography for such small devices can be extremely difficult. Restrictive design rules are required, and only a few patterns are feasible. A proposed solution has been to use unidirectional metal (metal that extends in a single direction, such as horizontally or vertically) for the metal 1 and metal 2 layers, instead of the conventional bidirectional metals, for both digital logic and SRAMs. However, at the extreme gate pitches or contact to poly pitch (CPP), gate shorts can occur.

A need therefore exists for efficient and cost effective methodology for producing SRAMs with good lithographic printability and reduced local interconnect to gate shorts, particularly for the 20 nm and 15 nm technology nodes, and beyond.

SUMMARY

An aspect of the present disclosure is an efficient method of fabricating an SRAM with self-aligned, bidirectional local interconnects.

Another aspect of the present disclosure is an SRAM with self-aligned, bidirectional local interconnects.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming active silicon regions on a substrate; forming gate electrodes over the active silicon regions; forming trenches overlying portions of the gate electrodes and active silicon regions; and filling the trenches with conductive material to form self-aligned local interconnects.

Aspects of the present disclosure include forming a hard mask layer over an upper surface of the gate electrodes prior to forming the trenches; and etching the hard mask layer to expose a portion of each gate electrode underlying trenches, prior to filling the trenches. A further aspect includes forming first vias to expose portions of the local interconnect material; and forming a first pattern of metal tracks over the vias, wherein the vias connect the first metal tracks to the local interconnects. Another aspect includes forming second vias to expose portions of the first metal pattern; and forming a second pattern of metal tracks over the second vias, wherein the second vias connect the second metal tracks to the first metal tracks. A further aspect includes forming third vias to expose portions of the second metal tracks; and forming a third metal pattern over the third vias, wherein the third vias connect the third metal tracks to the second metal tracks. An additional aspect includes extending the local interconnects in two directions perpendicular to each other. Another aspect includes extending the first metal tracks in a single direction, perpendicular to the second metal tracks. Another aspect includes filling the trenches with tungsten to form the local interconnect material.

Another aspect of the present disclosure is an SRAM comprising: active silicon regions on a substrate; gate electrodes over the active silicon regions; and self-aligned local interconnects overlying portions of the gate electrodes and active silicon regions.

Aspects include a hard mask layer over portions of an upper surface of the gate electrodes where the local interconnects do not contact the gate electrodes. A further aspect includes first vias exposing portions of the local interconnects; and a first pattern of metal tracks over the vias, wherein the vias connect the first metal tracks to the local interconnects. Another aspect includes second vias exposing portions of the first metal pattern; and a second pattern of metal tracks over the second vias, wherein the second vias connect the second metal tracks to the first metal tracks. An additional aspect includes third vias exposing portions of the second metal tracks; and a third metal pattern over the third vias, wherein the third vias connect the third metal tracks to the second metal tracks. Another aspect includes the local interconnects extending in two directions perpendicular to each other. Another aspect includes the first metal tracks extend in a single direction perpendicular to the second metal tracks. A further aspect includes tungsten as the local interconnect material.

Another aspect of the present disclosure is a method of fabricating a static random access memory (SRAM), the method comprising: forming active silicon regions on a substrate; forming gate electrodes over the active silicon regions; forming a hard mask layer over an upper surface of the gate electrodes; etching the hard mask layer to expose a portion of each gate electrode; forming self-aligned local interconnect trenches over exposed portions of the gate electrodes and portions of the active silicon regions, wherein the trenches extend in two directions perpendicular to each other; and filling the trenches with tungsten to form local interconnects which extend in two directions perpendicular to each other. An additional aspect includes forming first vias to expose portions of the local interconnects; forming a first pattern of metal tracks in a single direction over the vias, wherein the vias connect the first metal tracks to the local interconnects; forming second vias to expose portions of the first metal pattern; forming a second pattern of metal tracks over the second vias, wherein the second vias connect the second metal tracks to the first metal tracks; forming third vias to expose portions of the second metal tracks; and forming a third metal pattern over the third vias, wherein the third vias connect the third metal tracks to the second metal tracks.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A-2J schematically illustrate an arrayed 6T SRAM bit cell as single layer patterns, according to an exemplary embodiment.

DETAILED DESCRIPTION

Figure 1:
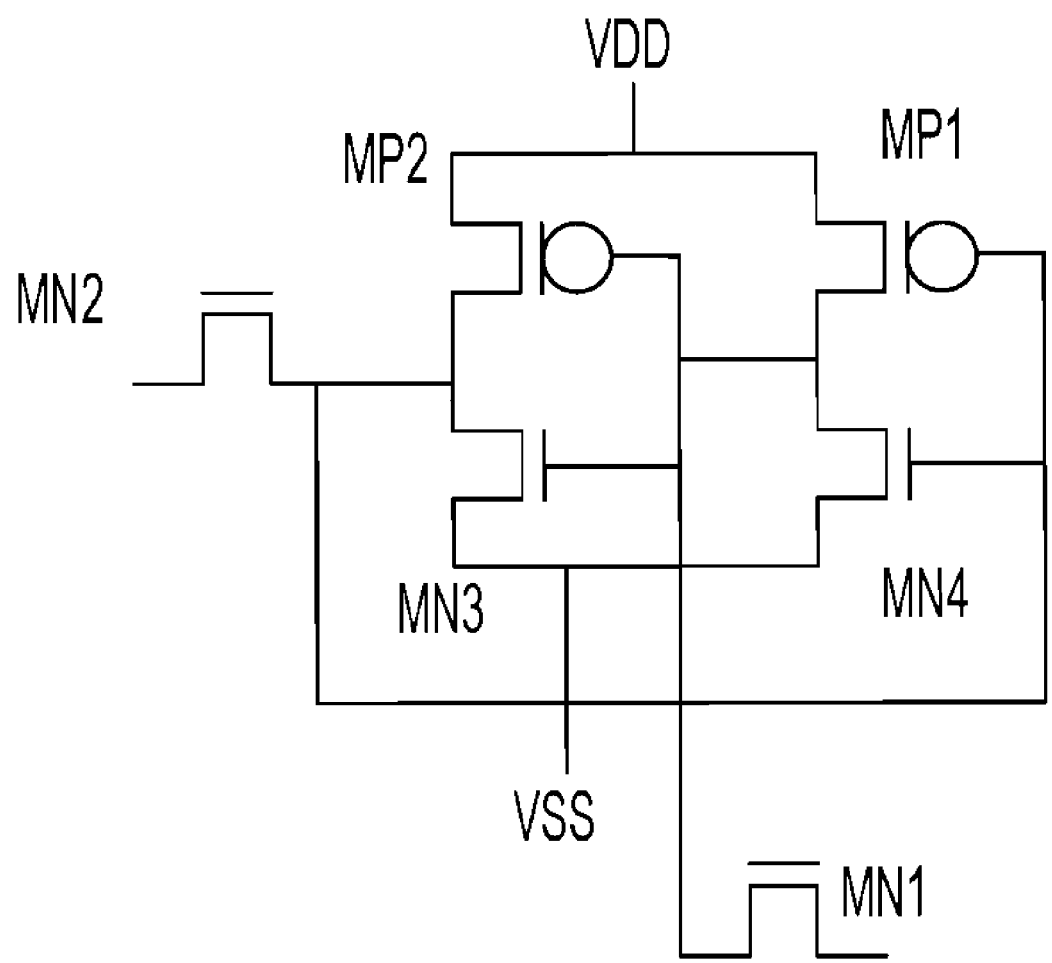
FIG. 1 schematically illustrates a 6T SRAM, according to an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the problem of gate shorts developing in SRAMs, which adversely affect performance, as in 15 nm and 20 nm SRAMs. In accordance with embodiments of the present disclosure, self-aligned local interconnect or contact processing is performed and bidirectional local interconnects and via 0 layers are used. As a consequence of self-alignment and bidirectional local interconnect layers, 20 nm and 15 nm SRAMs, and beyond, can be lithographically formed with a lower incidence of local interconnect to gate shorts.

Embodiments of the present disclosure include forming active silicon regions on a substrate, forming gate electrodes over the active silicon regions, forming trenches overlying portions of the gate electrodes and active silicon regions, and filling the trenches with conductive material, e.g., tungsten, to form self-aligned local interconnects. Embodiments include forming a hard mask layer over an upper surface of the gate electrodes prior to forming the trenches, and etching the hard mask layer to expose a portion of each gate electrode underlying trenches, prior to filling the trenches. Embodiments further include forming first vias to expose portions of the local interconnect material, and forming a first pattern of metal tracks over the vias, such that the vias connect the first metal tracks to the local interconnects. In addition second vias are formed to expose portions of the first metal pattern, and a second pattern of metal tracks is formed over the second vias, such that the second vias connect the second metal tracks to the first metal tracks. Third vias are formed to expose portions of the second metal tracks, and a third metal pattern is formed over the third vias, such that the third vias connect the third metal tracks to the second metal tracks. The local interconnects may extend in two directions perpendicular to each other, whereas the first metal tracks may extend in a single direction. The second metal tracks may extend in a direction perpendicular to the first metal tracks.

An SRAM device in accordance with embodiments of the present disclosure includes active silicon regions on a substrate, gate electrodes over the active silicon regions, and self-aligned local interconnects, for example of tungsten, overlying portions of the gate electrodes and active silicon regions. An SRAM may include a hard mask layer, such as a silicon nitride or a silicon oxide, over portions of an upper surface of the gate electrodes where the local interconnects do not contact the gate electrodes. An SRAM in accordance with embodiments of the disclosure further includes first vias exposing portions of the local interconnects, and a first pattern of metal tracks over the vias, such that the vias connect the first metal tracks to the local interconnects. Second vias expose portions of the first metal pattern, and a second pattern of metal tracks is formed over the second vias, such that the second vias connect the second metal tracks to the first metal tracks. Similarly, third vias expose portions of the second metal tracks, and a third metal pattern is formed over the third vias, such that the third vias connect the third metal tracks to the second metal tracks. The local interconnects may extend in two directions perpendicular to each other, whereas the first metal tracks may extend in a single direction. The first metal tracks may also extend in a direction perpendicular to the second metal tracks. As a result of the self-aligned and bidirectional local interconnects and the hard mask material over the gate electrodes, 15 nm SRAMs can be lithographically formed with a lower incidence of local interconnect to gate shorts.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

A schematic of a six transistor (6T) SRAM in accordance with an embodiment of the present disclosure is illustrated in FIG. 1. As seen in FIG. 1, four N-type MOSFET transistors, MN1-MN4, and two P-type MOSFET transistors, MP1-MP2, are interconnected between positive voltage supply, VDD, and negative voltage supply, VSS, to form a 6T SRAM. With the number of interconnections, for example between the gate of one transistor and the source or drain of at least one other, as the size of the SRAM decreases, local interconnect to gate shorts are more and more likely to occur.

FIGS. 2A-2J sequentially illustrate the steps/single layer patterns formed in the production of an SRAM bit cell in accordance with an exemplary embodiment. The dashed line 201 in each figure represents the border of a single bit cell.

Adverting to FIG. 2A, active regions are formed in a conventional manner in a silicon substrate. The active regions 203 constitute the source and drain for each of the six transistors. Next, as shown in FIG. 2B, gate electrodes 205 for the six transistors are patterned over the active silicon regions, with a high-K gate dielectric layer, such as a hafnium oxide layer, (not shown for illustrative convenience) therebetween. The gate electrodes 205 may be formed by a sidewall image transfer (SIT) process, leaving a gate hard mask layer overlying the gate electrode material and with side spacers along the length of the gate electrodes. The gate hard mask layer is nonconductive, for example an oxide or a nitride. The gate hard mask electrically isolates the gate electrodes 205 from local interconnects later formed over the gate electrodes. An interlayer dielectric, such as an oxide, (not shown for illustrative convenience) is formed over the gate electrodes 205. The gate electrodes 205, gate hard mask, and side spacers are further explained with respect to FIGS. 3A-3J.

FIG. 2C illustrates the formation of local interconnect trenches 207, as by etching. The trenches 207 extend down through the interlayer dielectric to the insulating layer formed over the silicon and down to the active silicon regions 203. The gate hard mask layer prevents the gate electrodes from being exposed during the formation of the trenches 207. The trenches 207 are bidirectional, i.e., they extend in two directions which are perpendicular to each other, for example forming L-shapes as at 207a.

After the trenches 207 are etched, the gate hard mask is selectively etched to expose only those portions of the gate electrodes which are to electrically connect to local interconnects. The squares 209 in FIG. 2D represent the positions where the gate hard mask is etched to expose the gate electrodes 205. Once the gate hard mask is etched, the local interconnect trenches 207 are filled with a conductive material, such as tungsten. Alternatively, a copper-based material may be used for the local interconnects. The resulting local interconnects are self-aligned, which allows tighter pitches to be achieved in the bit cell and allows the local interconnect horizontal direction to be placed on the metal 1 pitch. The local interconnect vertical direction by default will follow the CPP or gate pitch. The process of forming self-aligned local interconnects will be explained in more detail with respect to FIGS. 3A-3J.

Another interlayer dielectric (not shown for illustrative convenience) is formed over the local interconnects, and via zero (V0) is formed therethrough, as indicated in FIG. 2E, to form connections to the local interconnects. A metal 1 layer, for example of copper, is formed over the interlayer dielectric and V0 and is patterned such that V0 connects the metal 1 layer to the local interconnects. The metal 1 tracks (M1) that result from the patterning are unidirectional, meaning that there is one preferred orientation for the metal. Although M1 is shown in FIG. 2F as extending in a horizontal direction, alternatively the metal 1 pattern may extend in a vertical direction. The bidirectional local interconnects and V0 layer make all of the gate, source, drain, and metal 1 connections.

Another interlayer dielectric layer (not shown for illustrative convenience) is formed over the metal 1 pattern. In FIG. 2G, via 1 (V1) is formed through the dielectric layer, extending down to M1. A metal 2 layer is formed and patterned into metal 2 tracks (M2) that are unidirectional in a direction perpendicular to M1, as shown in FIG. 2H. Another interlayer dielectric layer (not shown for illustrative convenience) is formed over M2. In 2I, via 2 (V2) is formed through the dielectric layer, extending down to M2. Metal 3 layer is formed and patterned forming metal tracks M3 over V2, such that V2 connects M3 to M1.

Based on Moore's law scaling, the target bit cell area for a 6T SRAM for 15 nm node technology should be about 0.050 $\mu m^2$. The disclosed cell architecture will enable the achievement of bit cell sizes that will be aligned with industry published scaling curves in accordance with Moore's law.

Figure 3A:
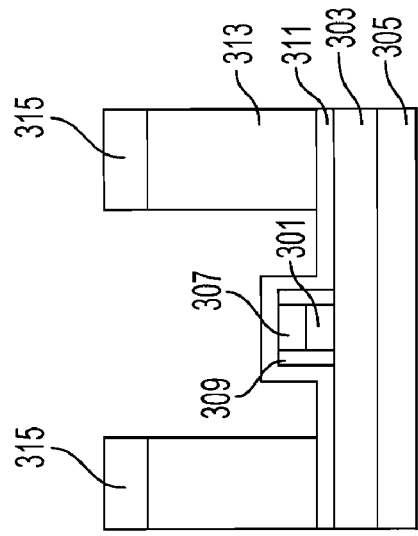
FIGS. 3A-3J schematically illustrate a self-aligned local interconnect process, according to an exemplary embodiment.

Adverting to FIGS. 3A-3J (wherein like reference characters denote like features), a process of forming self-aligned local interconnects for an SRAM is schematically illustrated, according to an exemplary embodiment. As shown in FIG. 3A, gate electrode 301 is formed, as by a SIT process, on oxide layer 303, which in turn is formed on silicon layer 305. Gate electrode 301 extends as illustrated in FIG. 2B. A nonconductive gate hard mask 307, such as a nitride, is formed over gate electrode 301. Sidewall spacers 309 are formed on both sides of gate electrode 301. A contact etch stop layer 311 is formed over the gate hard mask 307, sidewall spacers 309, and oxide layer 303. Another oxide layer 313 is formed over contact etch stop layer 311. A resist 315 is formed on oxide layer 313 with an opening where local interconnect trenches are to be formed.

Figure 3B:
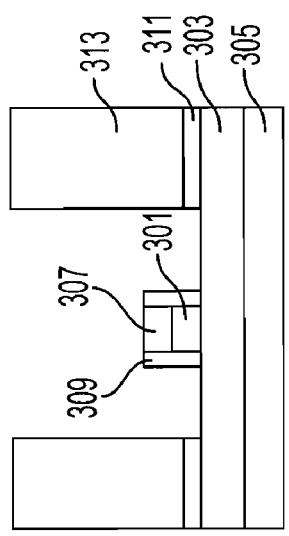
Figure 3C:
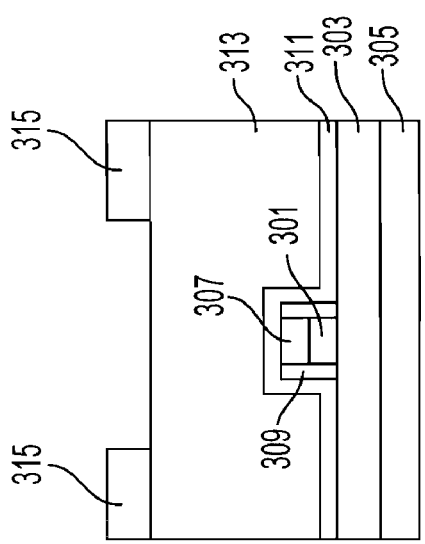
Figure 3D:
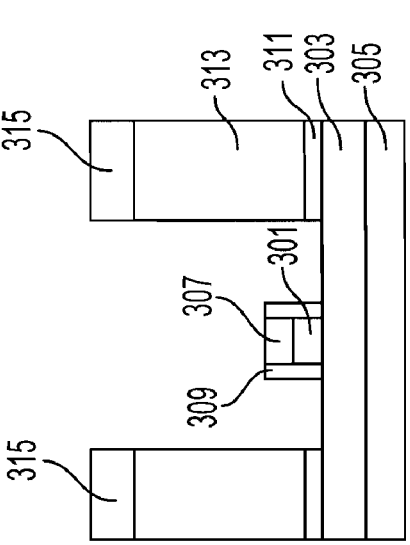
Figure 3E:
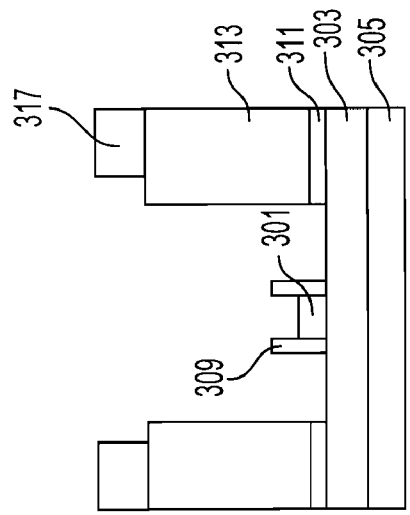

In FIG. 3B, oxide layer 313 is etched down to contact etch stop layer 311 using resist 315 as a mask, thereby forming local interconnect trenches as illustrated in FIG. 2C. In FIG. 3C contact etch stop layer 311 is etched using resist 315 as a mask. Resist 315 is then removed in FIG. 3D.

Figure 3F:
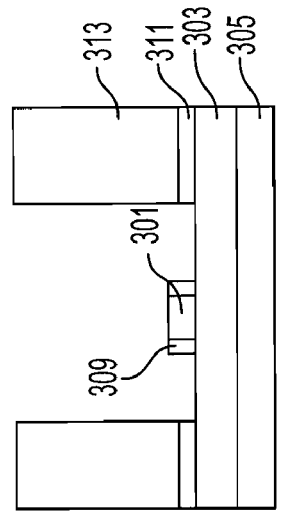

A second resist 317 is formed over oxide 313, with openings that correspond to those illustrated in FIG. 2D, only over portions of the gate electrode 301 that are to connect to a local interconnect. Since the resist has a different etch selectivity than oxide 313, the opening need not align perfectly with the edges of oxide 313. In FIG. 3F, the gate hard mask is etched using the resist as a mask.

Figure 3G:
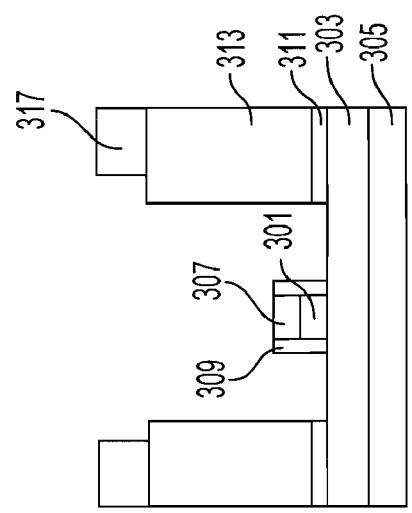
Figure 3H:
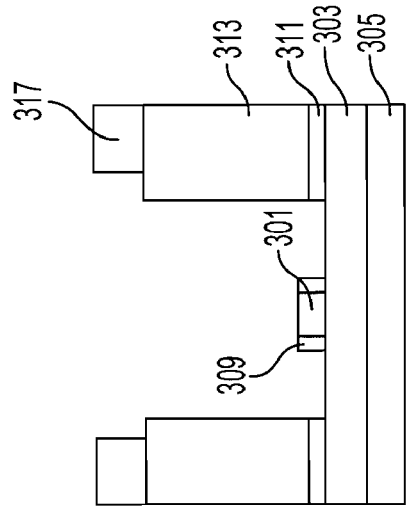
Figure 3J:
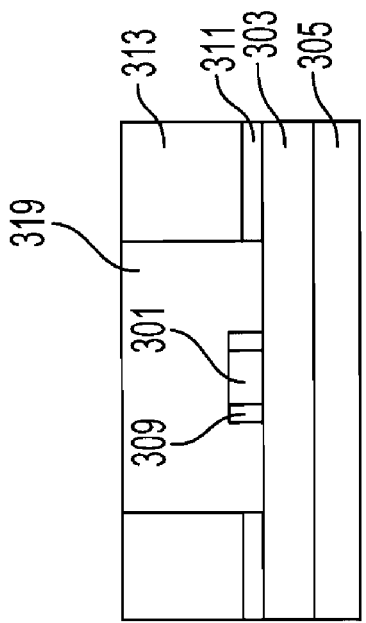
Figure 3I:
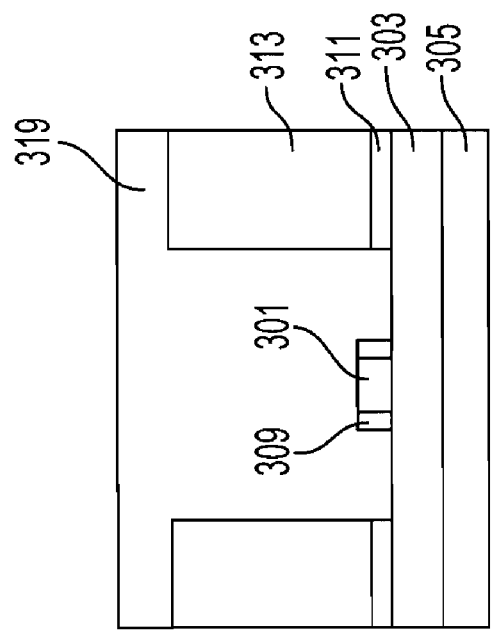

After the hard mask is removed, the sidewall spacers 309 on either side of gate electrode 301 are etched back to be coplanar with gate electrode 301, as illustrated in FIG. 3G. As illustrated in FIG. 3H, resist 317 is then removed. A conductive material 319, e.g., tungsten, is then deposited in the local interconnect trench, as shown in FIG. 3I. Conductive material 319 and oxide 313 are then planarized, as by chemical mechanical polishing (CMP).

Embodiments of the present disclosure can achieve several technical effects, including improved lithographic printability and reduced local interconnect to gate shorts, and thus improved SRAM yield. The present disclosure enjoys industrial applicability in fabricating any of various types 15 nm and beyond products that use 6T SRAM cell based cache.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating a static random access memory (SRAM), the method comprising:
    forming active silicon regions on a substrate;
    forming gate electrodes over the active silicon regions;
    forming a hard mask layer over an upper surface of the gate electrodes;
    forming an etch stop layer over the hard mask layer and the active silicon regions;
    forming trenches down to the etch stop layer, the trenches overlying portions of the gate electrodes and active silicon regions;
    removing and exposing portions of the active silicon regions;

after removing the etch stop layer, etching the hard mask layer to expose a portion of each gate electrode underlying trenches; and filling the trenches with conductive material to form self-aligned local interconnects.

2. The method according to claim 1, further comprising:

forming first vias to expose portions of the conductive material in the trenches; and forming a first pattern of metal tracks over the first vias, wherein the first vias connect the first pattern of metal tracks to the self-aligned local interconnects.

3. The method according to claim 2, further comprising:

forming second vias to expose portions of the first pattern of metal tracks; and forming a second pattern of metal tracks over the second vias, wherein the second vias connect the second pattern of metal tracks to the first pattern of metal tracks.

4. The method according to claim 3, further comprising:

forming third vias to expose portions of the second pattern of metal tracks; and forming a third pattern of metal tracks over the third vias, wherein the third vias connect the third pattern of metal tracks to the second pattern of metal tracks.

5. The method according to claim 4, wherein the self-aligned local interconnects extend in two directions perpendicular to each other.

6. The method according to claim 5, wherein metal tracks of the first pattern of metal tracks extend in a single direction.

7. The method according to claim 6, wherein metal tracks of the first pattern of metal tracks extend in a direction perpendicular to metal tracks of the second pattern of metal tracks.

8. The method according to claim 7, further comprising filling the trenches with tungsten to form the self-aligned local interconnects.

9. A method of fabricating a static random access memory (SRAM), the method comprising:

forming active silicon regions on a substrate;

forming gate electrodes over the active silicon regions;

forming a hard mask layer over an upper surface of the gate electrodes;

forming an etch stop layer over the hard mask layer and the active silicon regions;

forming self-aligned local interconnect trenches over portions of the gate electrodes and exposing portions of the active silicon regions by:

etching down to the etch stop layer; and removing the etch stop layer, wherein the self-aligned local interconnect trenches extend in two directions perpendicular to each other;

after forming self-aligned local interconnect trenches, etching the hard mask layer to expose a portion of each gate electrode underlying self-aligned local interconnect trenches; and filling the self-aligned local interconnect trenches with tungsten to form local interconnects which extend in two directions perpendicular to each other.

10. The method according to claim 9, further comprising:

forming first vias to expose portions of the local interconnects;

forming a first pattern of metal tracks in a single direction over the first vias, wherein the first vias connect the first pattern of metal tracks to the local interconnects;

forming second vias to expose portions of the first pattern of metal tracks;

forming a second pattern of metal tracks over the second vias, wherein the second vias connect the second pattern of metal tracks to the first pattern of metal tracks;

forming third vias to expose portions of the second pattern of metal tracks; and forming a third pattern of metal tracks over the third vias, wherein the third vias connect the third pattern of metal tracks to the second pattern of metal tracks.

* * * * *